(12) United States Patent
Shin

(10) Patent No.: US 6,342,801 B1
(45) Date of Patent: Jan. 29, 2002

(54) DUTY CYCLE CORRECTION CIRCUIT OF DELAY LOCKED LOOP

(75) Inventor: Dong Woo Shin, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/606,281

(22) Filed: Jun. 29, 2000

(30) Foreign Application Priority Data

Jun. 29, 1999 (KR) .......................................... 99-25219

(51) Int. Cl.[7] ................................................ H03K 5/02
(52) U.S. Cl. ..................... 327/175; 327/158; 327/544
(58) Field of Search ................................ 327/156, 175, 327/544, 162, 158, 171; 365/233

(56) References Cited

U.S. PATENT DOCUMENTS

| | | | |
|---|---|---|---|
| 5,337,285 A | 8/1994 | Ware et al. | 365/227 |
| 5,440,514 A | 8/1995 | Flannagan et al. | 365/194 |
| 5,614,855 A * | 3/1997 | Lee et al. | 327/156 |
| 5,629,897 A | 5/1997 | Iwamoto et al. | 365/195 |
| 5,708,611 A | 1/1998 | Iwamoto et al. | 365/195 |
| 5,740,115 A | 4/1998 | Ishibashi et al. | 365/203 |
| 5,808,498 A * | 9/1998 | Donnelly et al. | 327/255 |
| 5,838,630 A | 11/1998 | Okajima | 365/233 |
| 5,920,510 A | 7/1999 | Yukutake et al. | 365/194 |
| 5,956,290 A | 9/1999 | Matsuzaki | 365/233 |
| 5,995,441 A | 11/1999 | Kato et al. | 365/233 |

FOREIGN PATENT DOCUMENTS

| | | |
|---|---|---|
| JP | 08147967 | 6/1996 |
| JP | 10171774 | 6/1998 |
| JP | 11025696 | 1/1999 |
| JP | 11120768 | 4/1999 |
| JP | 11185470 | 7/1999 |
| JP | 11210587 | 8/1999 |
| JP | 11214986 | 8/1999 |

* cited by examiner

Primary Examiner—Dinh T. Le
(74) Attorney, Agent, or Firm—Pillsbury Winthrop LLP

(57) ABSTRACT

A duty cycle correction circuit of a delay locked loop circuit in a Rambus DRAM, decreasing a clock locking time by previously correcting a storage capacitor value to a setting value so as to provide a duty cycle correction within a short time in exiting a power save mode of delay locked loop, and accordingly, can realize a the power save mode capable of a high speed movement and without a time limit.

8 Claims, 7 Drawing Sheets

DUTY CYCLE CORRECTION CIRCUIT OF DELAY LOCKED LOOP

BACKGROUND OF THE INVENTION

1. Field of the Invention

This invention relates to a duty cycle correction circuit of a delay locked loop in a Rambus dynamic random access memory (DRAM), and more particularly to a duty cycle correction circuit in a delay locked loop for reducing the refresh time by compulsorily correcting the capacitance of a storage capacitor lost in transition from a power save mode to a normal mode to a predetermined value.

2. Description of the Related Art

In general, a Rambus DRAM is a packet driving type memory device which transfer data and control signals with a packet. A Rambus controller controls Plural Rambus DRAMs through a Rambus channel and plural Rambus DRAMs are connected to a Rambus channel. A Rambus interface is constituted in the respective Rambus DRAM, respectively so as to transfer data through the Rambus channel between them. Because the plural Rambus DRAMs coupled to the Rambus channel is controlled by one controller, the respective Rambus DRAMs have different phase differences so as to recognize the data and the control signals from the controller at the same time. That is, in case of the Rambus DRAM which is far separated from the controller, it makes the data to be processed fast and in case of the Rambus DRAM which is near the controller, it makes the data to be processed slowly.

Generally, the Rambus DRAM includes a normal mode and a power save mode, wherein the power save mode includes a nap mode and a power down mode. FIG. 1 shows a circuit of a Rambus DRAM having a power save mode in the prior art. The Rambus DRAM having the power save mode includes a packet controller 200 for analyzing a control packet signal Ctrl_PKT from an external channel to generate a control signal Cntrl for controlling a power mode operation and an operation code signal op_code for determining an operation mode.

The Rambus DRAM includes a power mode controller 300 which generates a nap mode signal Nap and a power down mode signal PDN and a self refresh enable signal Self_Refresh_en by the control signal Cntrl from the packet controller 200. The Rambus DRAM includes a delay locked loop circuit 400 which receives the power down mode signal PDN and the nap mode signal Nap and an external clock signal CLK_in to generate an internal clock signal CLK_out and a memory core 100 having a refresh counter controlled by the self refresh enable signal Self_refresh_en.

The packet controller 200 receives the packet control signal Ctrl_PKT from an external channel outside the Rambus DRAM and generates the control signal Cntrl and the operation code signal op_code. The control signal Cntrl is a signal for controlling whether the Rambus DRAM operates with the power save mode, or not and the operation code signal op_code is a signal of 2 bits for determining the respective operation modes. For example, in case of the operation code signal op_code of 2 bits, the op_code of "00" forbids the Rambus DRAM to be changed into the power save mode, and the op_code of "01" changes it to a power down mode, and the op_code of "10" changes it to a nap mode Nap and the op_code of "11" changes it to a doze mode.

The power mode controller 300 receives the operation code signal op_code and the control signal Cntrl from the packet controller 200 to generate the self refresh enable signal Self_Refresh_en to the memory core 100 and the nap mode signals Nap and the power down mode signals PDN to the delay locked loop circuit 400. The self refresh enable signal Self_fresh_en controls the refresh counter built in the memory core 100 to perform the self refresh operation. The nap mode signal Nap and the power down mode signal PDN control the delay locked loop (DLL) circuit 400 to operate in accordance with the power state.

The delay locked loop circuit 400 receives the clock signal CLK_in received from the exterior of the system and generates the internal clock signal CLK_out required interior the system with synchronization to the phase of the external clock signal CLK_in.

The construction and operation of the delay locked loop circuit 400 will be described with reference to FIG. 2. The delay locked loop circuit 400 includes a controller 410, a bias generator 420, a duty cycle correction circuit 430, a phase detector and mixer 440, a clock amplifying part 450 and a clock buffer 460. The controller 410 controls the bias generator 420, the duty cycle correction circuit 430 and the phase detector and mixer 440, the clock amplifying part 450 and the clock buffer 460 by the nap mode signal Nap and the power down mode signal PDN from the power mode controller in FIG. 1.

The duty cycle correction circuit 430 generates a control signal for controlling a clock pulse width of high or low state to the clock amplifying part 450 by a mode signal from the controller 410 and a bias signal from the bias generator 420. The clock buffer 460 generates the internal clock signal CLK_OUT having the same phase difference as the external clock signal CLK_IN to an interior of the system.

The phase detector and mixer 440 receives the external clock signal CLK_IN and the final clock signal CLK_OUT from the clock buffer 460 and compares the phases of the clock signals to control the clock amplifying part 450 and the clock buffer 460 to coincide the phase difference between the clock signals.

The clock amplifying part 450 amplifies the clock signal from the phase detector and mixer 440 and provides the amplified signal to the clock buffer 460. The bias generator 420 provides the bias to the duty cycle correction circuit 430 and the clock buffer 460 by the mode signal from the controller 410.

FIG. 3 shows the duty cycle correction circuit of the delay locked loop circuit in the prior art. The prior duty cycle correction circuit 430 includes a differential amplifying stage 432 which differential-amplifies two clock signals clki and clkib as input signals to generate output signals through nodes Nd6 and Nd7, when the bias voltage Vbiasn from the bias generator 420 has a high level and the mode signal napb which indicates not the nap mode Nap but the power save mode has a high level.

The prior duty cycle correction circuit 430 further includes a signal transfer switch stage 434 for providing the output signals Nd6 and Nd7 from the differential amplifying stage 432 to first and second output terminals dcc and dccb by control signals capon and caponb and a storage capacitor stage 436 for storing the output signals dcc and dccb of the first and second output signals.

First, when the bias voltage Vbiasn from the bias generator 420 has a high level and the mode signal napb indicating the power save mode has a high level, the NMOS transistors N3–N6, N9, N10, N15 and N16 and the PMOS transistors P1–P3 and P5–P7 are turned on to be ready to the differential amplifying stage 432 to operate. If the input signals clki and clkib are provided to gates of the NMOS transistors N1 and N2, the differential amplifying stage 432 generates the differential-amplified output signals though the node Nd6 and Nd7. If the bias voltage Vbiasn is a high level and the mode signal napb is a high level, when the clock signal clki is a high level and the clock signal clkib is a low level, the output signal of the node Nd6 becomes a low level and the output signal of the node Nd7 becomes a high level.

The signal transfer switching stage 434 includes a transfer gate including a PMOS transistor P9 and a NMOS transistor N19 for transferring the output signal Nd6 of the differential amplifying stage 432 as the output signal dccb by the control signals capon and caponb; a transfer gate including a PMOS transistor P12 and a NMOS transistor N20 for transferring the output signal Nd7 of the differential amplifying stage 432 as the output signal dcc by the control signals capon and caponb.

The signal transfer switching means 434 includes a NMOS transistor N21 for a capacitor connected between the control signal caponb and the output signal dccb; a PMOS transistor P10 for a capacitor connected between the output signal dccb and the control signal capon; and a NMOS transistor N22 for a capacitor connected between the control signal caponb and the output signal dcc and a PMOS transistor P11 for a capacitor connected between the output signal dcc and the control signal capon.

The signal transfer switching stage 434 provides the output signals Nd6 and Nd7 of the differential amplifying stage 432 as the output signals dccb and dcc when the control signal capon is a high level and the control signal caponb is a low level.

The storage capacitor stage 436 includes NMOS transistors N23 and N24 for capacitors connected between the output signal dccb and the ground voltage Vss and between the output signal dcc and the ground voltage Vss, respectively.

FIG. 4A shows a generator of the mode signal napb used in FIG. 3. The napb mode signal generator includes inverters INV1–IV3 connected in series for receiving the nap mode signal Nap to generate the mode signal napb. The nap mode signal Nap has the opposite phase to the mode signal napb. In the nap mode, the Nap signal is a high state and the napb signal is a low state. In the power save mode, the Nap signal is a low state and the napb signal is a high state.

FIG. 4B is a generator of the control signals capon and caponb used in FIG. 3. The control signal generator includes inverters INV4–INV7 connected in series for receiving the DLLhold signal to generate the control signal caponb and an inverter INV8 for receiving output signal of the inverter INV7 to generate the control signal capon. In the power save mode, the DLLhold signal is a high state and the control signals capon and the caponb are low and high states, respectively.

However, the prior duty cycle correction circuit 430 has a disadvantage as follows. In the power save mode, after the lapse of a long time, the data stored in the capacitor of the memory cell is lost owing to the leakage. It requires a setting time of several hundred of nanosecond ns to several microsecond $\mu s$ in order to set the lost data to the capacitor in the memory cell. Accordingly, in the power save mode of the Rambus DRAM which is the nap mode and the power down mode, in case of the nap mode which should use the data stored in the capacitor as it is, the exit time is about 100 ns. But the tolerance time is very short at several $\mu s$ and the power consumption of 4 mA is caused. In case of the power down mode, there is no limit of the tolerance time and the power consumption of 1 mA is caused. But the exit time is very long at several $\mu s$.

SUMMARY OF THE INVENTION

It is an object of the present invention to provide a duty cycle correction circuit of a delay locked loop to solve the problem that the refresh time for refreshing data to a storage capacitor in a power save mode is very short in a nap mode and the refresh time is very long in a power down mode having no time limit.

It is an object of the present invention to provide a duty cycle correction circuit of a delay locked loop having a power save function with high speed operation and no time limit by compulsorily correcting the capacitance of a storage capacitor lost in transition from a power save mode to a normal mode to a predetermined value.

According to an aspect of the present invention, there is provided to a duty cycle correction circuit of a delay locked loop of Rambus DRAM having a normal mode and a power save mode including a nap mode and a power down mode, comprising: a signal input unit receiving a first control signal, an enable signal, a first input signal and a first input bar signal, and outputting signals differentially amplifying the first input signal and the first input bar signal by a first potential difference to a first node and a second node when the first control signal indicates a nap mode in a state that the enable signal is active, and outputting signals differentially amplifying the first input signal and the first input bar signal by a second potential difference to a first node and a second node when the first control signal indicates the normal mode in a state that the enable signal is active; a signal output unit including a first storage unit connected between the first node and ground voltage and storing the signals of the first node, a second storage unit connected between the second node and ground voltage and storing the signals of the second node, a first voltage supplying unit transmitting ground voltage to the first node when a second signal indicates the power down mode, a second voltage supplying unit transmitting ground voltage to the second node when the second control signal indicates the power down mode, a first transmission gate unit transmitting ground voltage a signal of the first node to a first output terminal when the second control signal indicates a normal mode, a second transmission gate unit transmitting a signal of the second node to a second output terminal when the second control signal indicates a normal mode, a third storage unit connected between the first output terminal and ground voltage and storing signals of the first output terminal, a fourth storage unit connected between the second output terminal and ground voltage and storing signals of the second output terminal, a third voltage supplying unit discharging the first output terminal to ground voltage when the second control signal indicates the power down mode, a fourth voltage supplying unit discharging the second output terminal to ground voltage when the second control signal indicates the power down mode; and a signal transfer unit connected between the signal input unit and the signal output unit, the signal transfer unit connecting the signal input unit and the signal output unit when the third control signal indicates the normal mode, and the signal transfer unit blocking the connection between the signal input unit and the signal output unit when the third control signal indicates the power save mode.

In the duty cycle correction circuit, each of the first to fourth storing units is comprised of a capacitor which is a NMOS transistor.

In the duty cycle correction circuit, the first power voltage is a power supply voltage of Vdd and the second power voltage is a ground voltage of Vss.

In the duty cycle correction circuit, each of the first and second voltage supply units is comprised of a PMOS transistor and each of the third and fourth voltage supply units is comprised of a NMOS transistor.

In the duty cycle correction circuit, the signal transfer unit is comprised of a transmission gate. The capacitor is comprised of MOS transistors and preferably a PMOS transistor and a NMOS transistor.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 3:
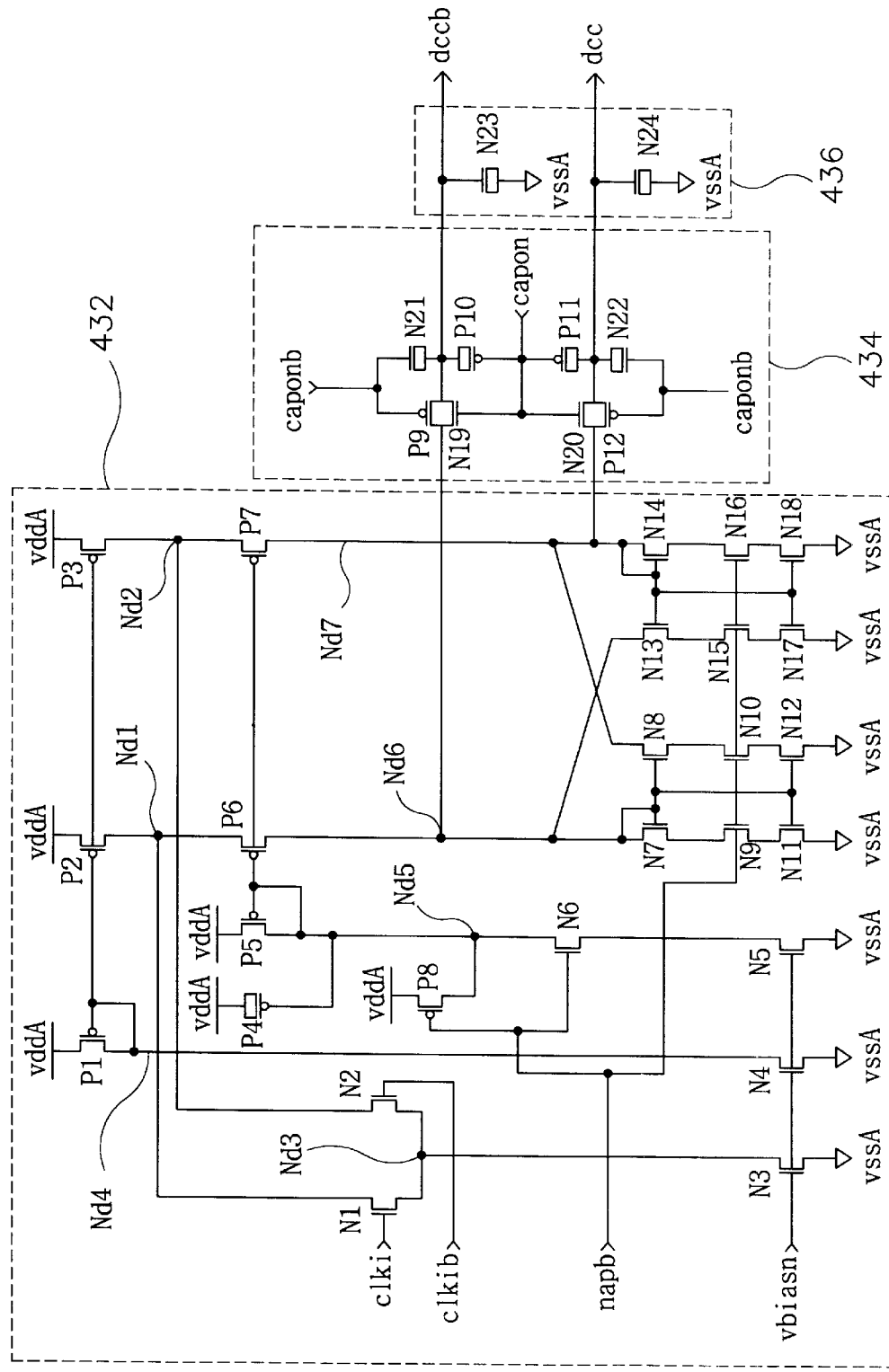
FIG. 3 is a duty cycle correction circuit of the delay locked loop circuit in the prior art.
Figure 4A:
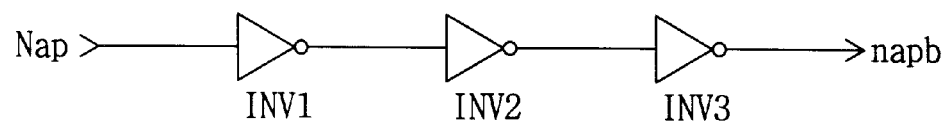
FIG. 4A is a circuit diagram of a napb mode signal generator in FIG. 3.
Figure 4B:
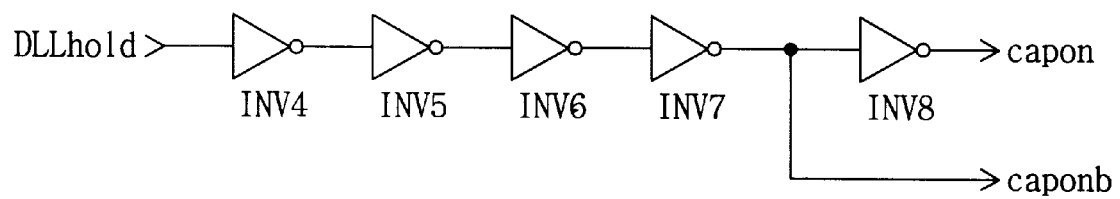
FIG. 4B is a circuit diagram of a control signal capon and caponb generator in FIG. 3.
Figure 5:
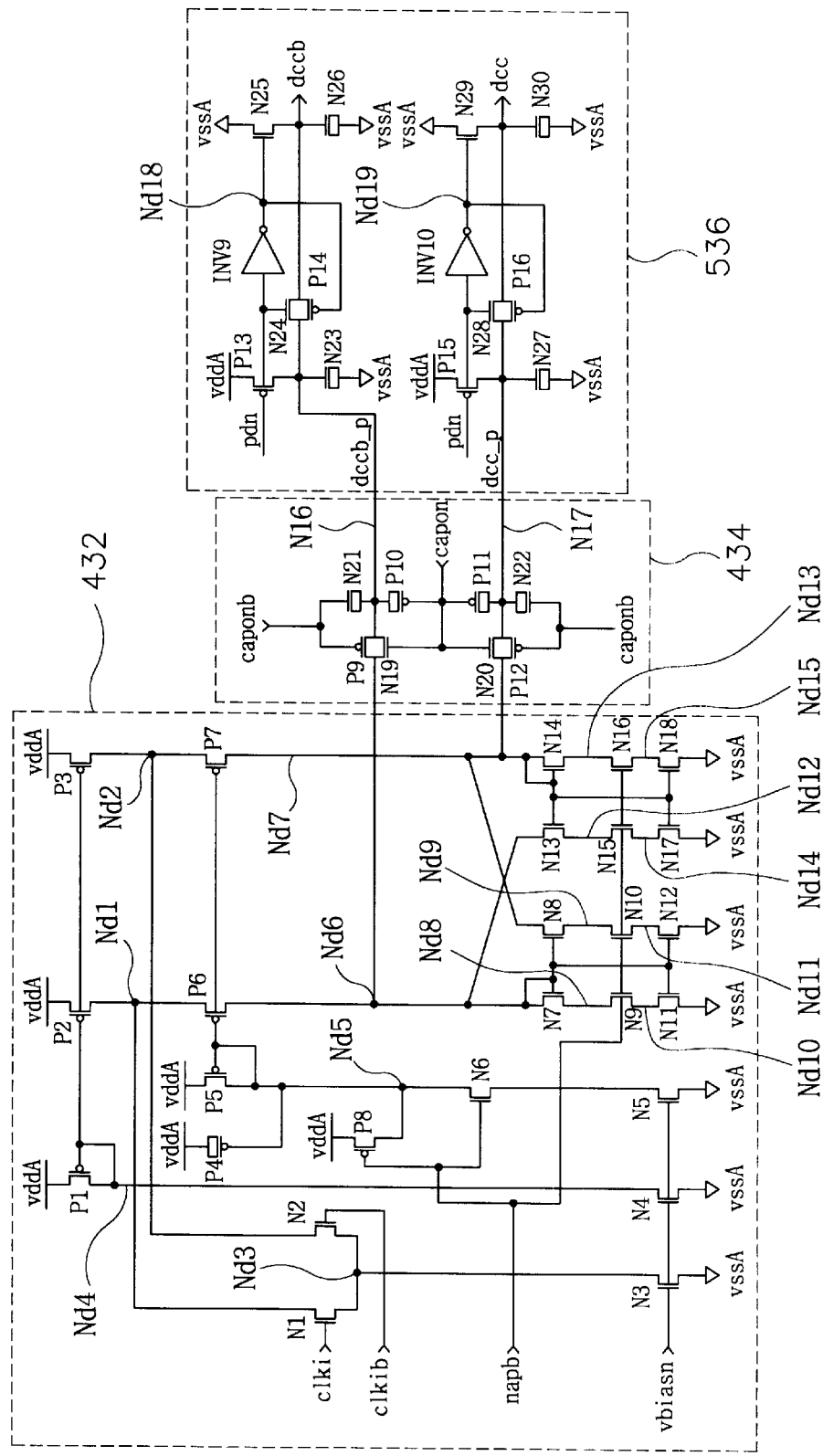
FIG. 5 is a circuit diagram of a duty cycle correction circuit of a delay locked loop circuit in accordance with an embodiment of the present invention.

FIG. 5 shows a block diagram of a duty cycle correction circuit in a delay locked loop circuit of a semiconductor memory device in accordance with an embodiment of the present invention. The duty cycle correction circuit in the delay locked loop circuit of the present invention includes a differential amplifying stage 432, a signal transfer switch stage 434, and a storage capacitor correction stage 536. The same reference numbers in FIG. 5 has the same function as that in FIG. 3 and will be omitted.

The construction and operation of the differential amplifying state 432 will be described as follows. A third to a fifth NMOS transistors N3–N5 make potentials of a third to a fifth nodes Nd3–Nd5 to drain to a ground voltage VssA by a bias signal Vbiasn. A first and a second NMOS transistors N1 and N2 make potentials of a first and a second nodes Nd1 and Nd2 to drain to the ground voltage VssA through the third NMOS transistor N3 in accordance with voltage levels of the clock signals clki and clkib. A first to a third PMOS transistors P1–P3 constitutes a current mirror that provide the power voltage VddA to a four, a second and a first nodes Nd4, Nd2 and Nd1 in accordance with the potential of the fourth node Nd4.

A sixth NMOS transistor N6 makes the potential of a fifth node Nd5 to drain to the ground voltage VssA through the fifth NMOS transistor N5, if the napb signal is a high state i.e. the power save mode. An eighth PMOS transistor P8 provides the power supply voltage VddA to the fifth node Nd5, if the napb signal is a low state i.e. the nap mode. A fourth PMOS transistor P4 is constituted with a capacitor type so as to provide always the power voltage VddA to the fifth node Nd5.

A fifth PMOS transistor P5 provides the power supply voltage VddA to the fifth node Nd5 by the potential of the fifth node Nd5 and a sixth PMOS transistor P6 provides the potential of the first node Nd1 to a sixth node Nd6 of an output terminal by the potential of the fifth node Nd5 and a seventh PMOS transistor P7 provides the potential of the node Nd2 to a seventh node Nd7 of an output terminal by the potential of the fifth node Nd5.

A seventh and an eighth NMOS transistors provide the potentials of the sixth and the seventh nodes Nd6 and Nd7 to an eighth and an ninth nodes Nd8 and Nd9 by the potential of the sixth node Nd6, respectively. A ninth and a tenth NMOS transistors N9 and N10 provide the potentials of the eighth and the ninth nodes Nd8 and Nd9 to a tenth and an eleventh nodes Nd10 and Nd11 by the napb signal, respectively. An eleventh and a twelfth NMOS transistors N11 and N12 make the potentials of the tenth and the eleventh nodes to drain to the ground voltage VssA by the potential of the node Nd6.

A thirteenth and a fourteenth NMOS transistors N13 and N14 provide the potentials of the sixth and seventh nodes Nd6 and Nd7 to a twelfth and a thirteenth nodes Nd12 and Nd13 by the potential of the seventh node Nd7, respectively. A fifteenth and a sixteenth NMOS transistors N15 and N16 provide the potentials of the twelfth and thirteenth nodes Nd12 and Nd13 to a fourteen and fifteen nodes Nd14 and Nd15 by the napb signal, respectively. A seventeen and a eighteenth NMOS transistors N17 and N18 make the potentials of the thirteenth and fourteenth nodes Nd13 and Nd14 to drain to the ground voltage VssA by the potential of the seventh node Nd7, respectively.

Figure 1:
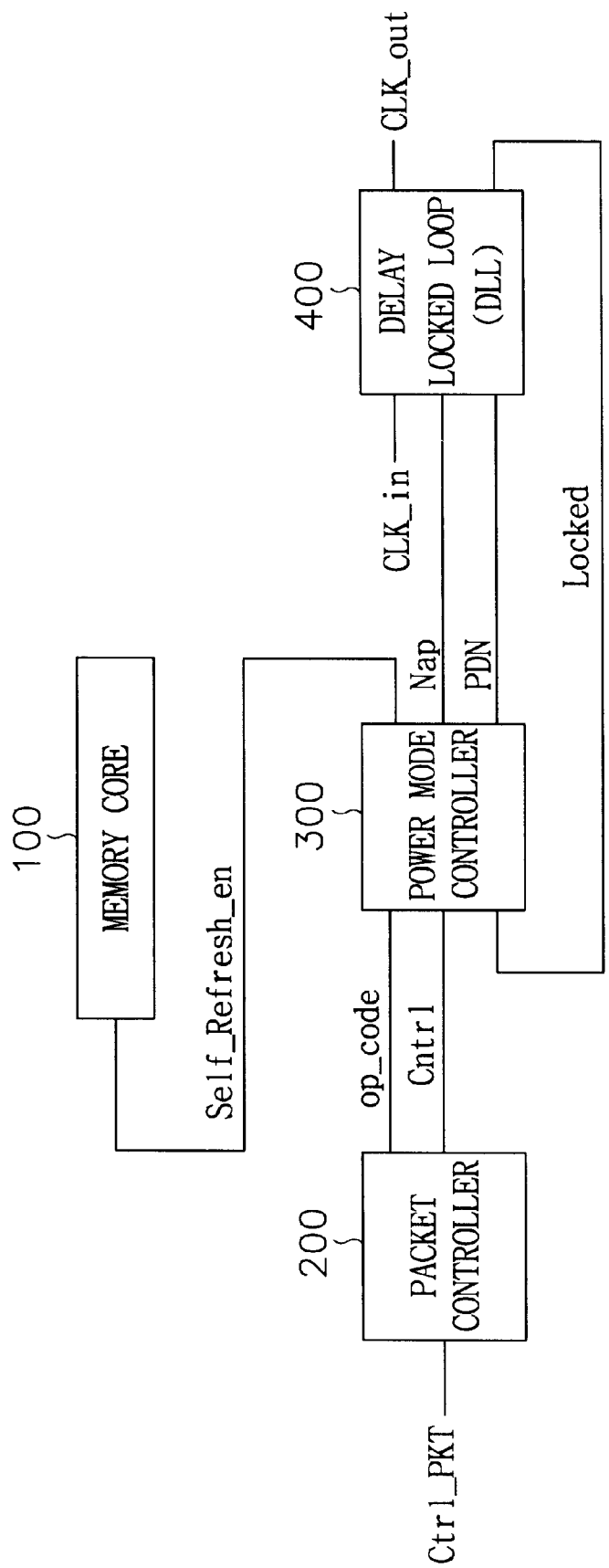
FIG. 1 is a block diagram of a conventional Rambus DRAM having a power save mode function.
Figure 2:
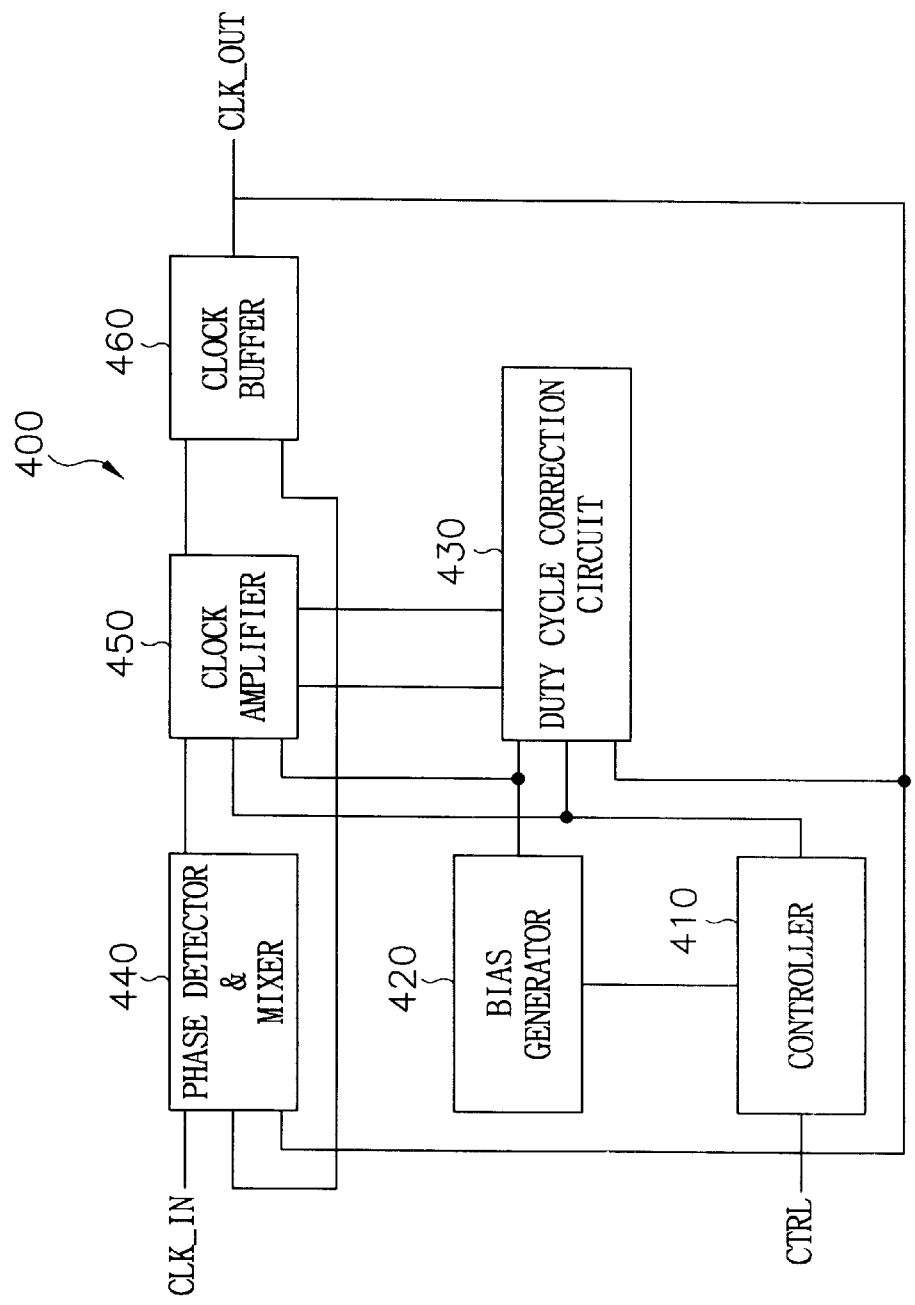
FIG. 2 is a block diagram of a delay locked loop circuit in FIG. 1.

As above constructed, if the bias signal Vbiasn of high state generated from the bias generator in FIG. 2 is received and the napb signal of high state indicating the power save mode is received, the differential amplifying stage 432 receives the clock signal clki and the clock bar signal clkib and provides the differential-amplified output signals through the first output node ND6 and the second output node Nd7.

The construction and operation of the signal transfer switching stage 434 will be described as follows. Referring to FIG. 5, the signal transfer switching stage 434 has a construction as follows. A transfer gate including a PMOS transistor P9 and a NMOS transistor N19 provides the output signal of the differential amplifying stage 42 at the node Nd6 to a sixteen node N16 by control signals capon and caponb. A transfer gate including a PMOS transistor P12 and a NMOS transistor N20 provides the output signal of the differential amplifying stage 432 at the node Nd7 to a seventeenth node Nd17 by the control signals capon and caponb. A NMOS transistor N21 for a capacitor and a PMOS transistor P10 for a capacitor pump the potential of the sixteenth node Nd16 by the control signals capon and caponb. A NMOS transistor N22 for a capacitor and a PMOS transistor P11 for a capacitor pump the potential of the seventeenth node Nd17 by the control signals capon and caponb.

As above constructed, the signal transfer switching stage 434 provides the output signals Nd6 and Nd7 from the differential amplifying stage 432 to the sixteenth node Nd16 and the seventeenth node Nd17 by the control signals capon and caponb, respectively.

The storage capacitor correction stage 536 is to compulsorily correct the capacitance lost in transition from the power save to the normal mode to the predetermined value. Referring to FIG. 5, the construction and operation of the storage capacitor correction stage 536 will be described as follows. A transfer gate including a NMOS transistor N24 and a PMOS transistor P14 provides the signal of the sixteenth node Nd16 to an output terminal dccb by control signals pdn and an inverted signal Nd18 of the control signal pdn from an inverter INV9. A PMOS transistor P13 provides a power supply voltage VddA to the sixteenth node N16 by the control signal pdn. A NMOS transistor N23 for a capacitor is connected between the sixteenth node Nd16 and a ground voltage VssA and stores the potential of the sixteenth node Nd16 for a constant time. Herein, the control signal has a low level in transition from the power save mode to the normal mode. Accordingly, if the semiconductor memory device is transited from the power save mode to the normal mode, the PMOS transistor P13 and a NMOS transistor N25 are turned on by the control signal pdn and the inverted signal Nd19 of the control signal pdn from the inverter INV9, respectively. The power supply voltage VddA and the ground voltage VssA are provided to the sixteenth node Nd16 and the output terminal dccb, respectively.

A transfer gate including a NMOS transistor N28 and a PMOS transistor P16 provides the output signal of the seventeenth node Nd17 from the signal transfer switching stage 434 to the output terminal dcc by the control signal pdn and an inverted signal Nd19 of the control signal pdn from the inverter INV10. A PMOS transistor P15 provides the power supply voltage VddA to the seventeenth node Nd17 by the control signal pdn. A NMOS transistor N27 for a capacitor is connected between the seventeenth node Nd17 and the ground voltage VssA and stores the potential of the seventeenth node Nd17 for a constant. Similarly, the control signal pdn has a low level in transition from the power save mode to the normal mode. Accordingly, if the semiconductor memory device is transited from the power save mode to the normal mode, the PMOS transistor P15 and a NMOS transistor N29 are turned on by the control signal pdn and the inverted signal Nd19 of the control signal pdn from the inverter INV10, respectively. The power supply voltage VddA and the ground voltage VssA are provided to the seventeenth node Nd17 and the output terminal dcc, respectively.

Figure 6A:
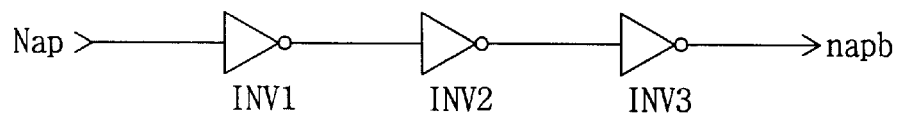
FIG. 6A is a circuit diagram of a napb mode signal generator in FIG. 5.

FIG. 6A shows a mode signal generator of the napb mode used in FIG. 5. The napb mode signal generator includes three inverters INV1–INV3 which are connected in series and receives the nap mode signal Nap to generate napb signal. Herein, the Nap signal has a high level in the nap mode and a low level in the power save mode and the napb signal has a low level in the nap mode and a high level of the power save mode.

Figure 6B:
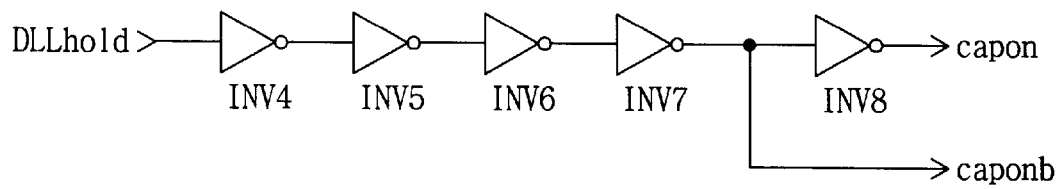
FIG. 6B is a circuit diagram of a control signal capon and caponb generator in FIG. 5.

FIG. 6b is a generator of the control signals capon and caponb used in FIG. 5. The control signal generator includes four inverters INV4–INV7 which are connected in series and receives a DLLhold as an input signal to generate the control signal caponb and an inverter INV8 for receiving the output signal caponb of the inverter INV7 to generate the control signal capon. Herein, the DLLhold signal has a high level in the power save mode and the control signals capon and caponb have low and high levels, respectively in the power save mode.

Figure 6C:
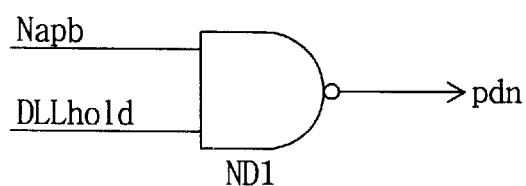
FIG. 6c is a circuit diagram of a pdn signal generator in FIG. 5.

FIG. 6c is a generator of the control signal pdn used in FIG. 5. The control signal generator includes a NAND gate ND1 which receives the napb signal from the napb signal generator of FIG. 6a and the DLLhold signal to generate the control signal pdn. The napb signal and the DLLhold signal have high level in the power save mode and therefore the NAND gate ND1 generates the control signal pdn of low level.

Hereinafter, the operation of the duty cycle correction circuit in DLL circuit of the present invention as above constructed will be described with reference to FIG. 5. If the semiconductor memory device is in the power save mode, the DLLhold signal becomes a high level. The Nap signal and the napb signal become low and high levels, respectively and the control signals capon and caponb become low and high states, respectively.

Accordingly, the PMOS transistor P9 and the NMOS transistor N19 for the transfer gate in the signal transfer switching state 434 are turned off and the output node N6 of the differential amplifying stage 432 is separated from the output node Nd16 of the signal transfer switching state 434. Similarly, the PMOS transistor P12 and the NMOS transistor N20 for the transfer gate in the signal transfer switching stage 434 are turned off and the output node Nd7 of the differential amplifying stage 432 is separated from the output node Nd17 of the signal transfer switching stage.

Besides, the pdn signal becomes a low state in a power save mode and then the PMOS transistor P14 and NMOS transistor N24 for the transfer gate in the storage capacitor correction stage 536 are turned off. The PMOS transistor P16 and the NMOS transistor N28 for the transfer gate in the storage capacitor correction stage 536 are also turned off.

The PMOS transistors P13 and P15 are turned on to provide the power supply voltage VddA to the capacitors N23 and N27. The NMOS transistors N25 and N29 are turn on by the inverted signal of the pdn signal from the inverter INV10 to provided the ground voltage VssA to the capacitors N26 and N30. At this time, the PMOS transistor P14 and the NMOS transistor for the transfer gate N24 are turned off by the pdn signal as well as the PMOS transistor P16 and the NMOS transistor N28 are turned off by the pdn signal. Therefore, the output nodes Nd16 and Nd17 of the signal transfer switching means 434 are separated from the final output terminals dccb and dcc, respectively.

On the other hand, if the semiconductor memory device is transited from the power save mode to the normal mode, the DLLhold signal is low state and then the control signals capon and caponb are high and low state, respectively, by the control signal generator as shown in FIG. 6B. Also, the pdn signal becomes a high stage by the control signal generator as shown in FIG. 6C.

Accordingly, the PMOS transistor P9 and the NMOS transistor N19 for the transfer gate in the signal transfer switching state 434 are turned on to provide the output signal Nd6 of the differential amplifying stage 432 to the output node Nd16 of the signal transfer switching state 434. Similarly, the PMOS transistor P12 and the NMOS transistor N20 for the transfer gate in the signal transfer switching stage 434 are turned on to provide the output node Nd7 of the differential amplifying stage 432 to the output node Nd17 of the signal transfer switching stage 434.

Besides, the pdn signal becomes a high state and then the PMOS transistor P13 and NMOS transistor N25 in the storage capacitor correction stage 536 are turned off. The NMOS transistor N24 and the PMOS transistor P14 for the transfer gate are turned on to provide the output signal N16 of the signal transfer switching stage 434 to the final output terminal dccb. At this time, the charge distribution between the storage capacitor N23 and N26 is caused by the turn on of the transfer gate N24 and P14 to have an equipotential state.

Similarly, the PMOS transistor P15 and the NMOS transistor N29 of the storage capacitor correction stage 536 are turned off and the NMOS transistor N28 and the PMOS transistor P16 for the transfer gate are turned on. The output signal Nd17 of the signal transfer switching stage 434 are provided to the final output terminal dcc. At this time, the charge distribution between the storage capacitor N27 and N30 is caused by the turn on of the transfer gate N28 and P16 to have an equipotential state.

The capacitance of the storage capacitors N23, N26 and N27, N30 are determined that voltage level in the voltage distribution is equal to that in the normal operation by calculating the voltage level of the final output terminals dcc and dccb.

Figure 7:
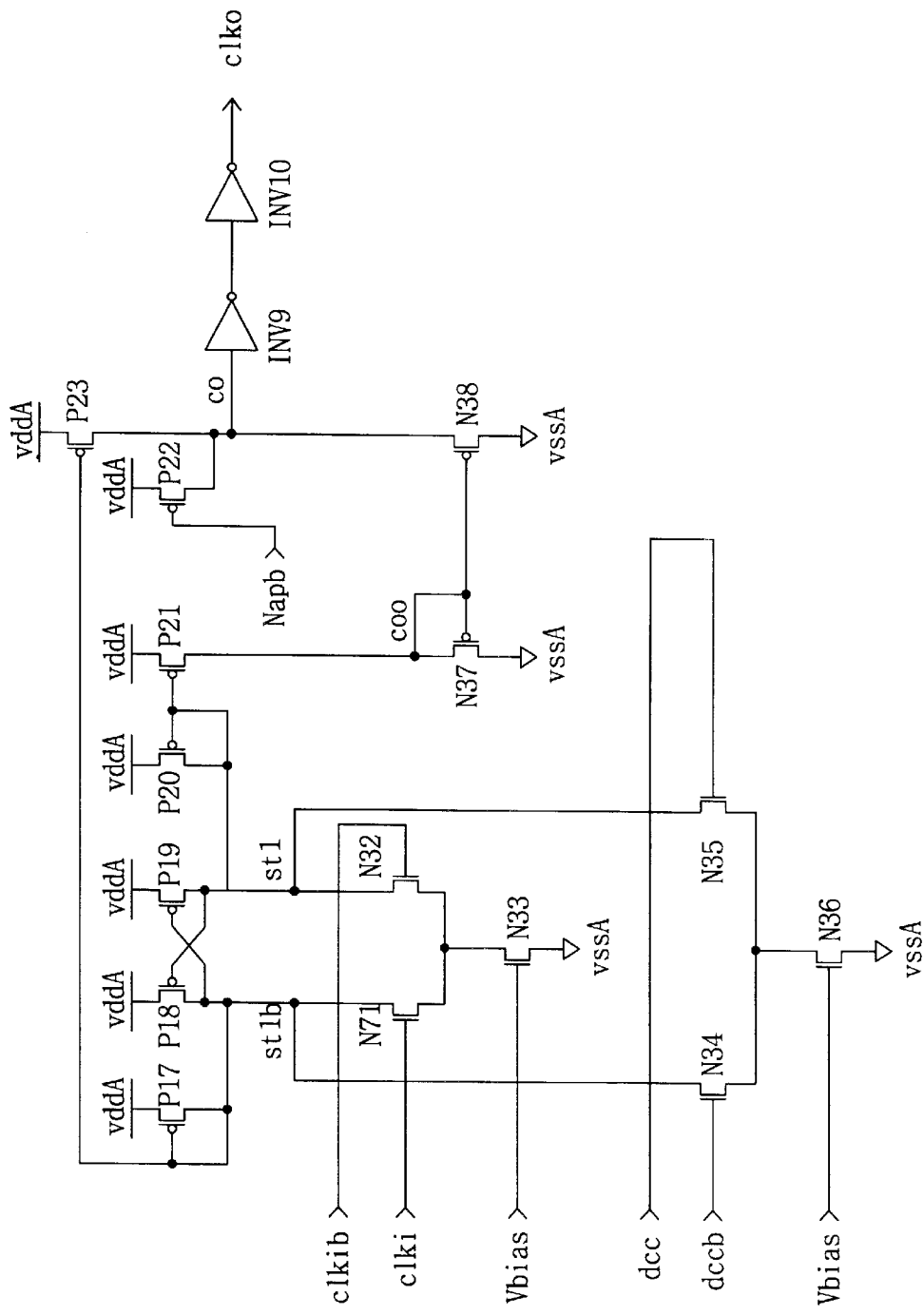
FIG. 7 is a circuit diagram of a clock amplifying circuit operated by the duty cycle correction circuit of the delay locked loop circuit in the present invention.

On the other hand, the output signals of the final output terminals dcc and dccb are provided to the clock amplifying circuit in FIG. 7 to control the clock pulse width of low state or high state. Accordingly, when the Rambus DRAM is transited from the power save mode to the normal mode, the duty cycle correction circuit makes the lost value of the capacitor to be compulsorily corrected and then the Rambus DRAM carries out the power save function having fast setting time without no limit of the using time.

According to the present invention, so as to solve the problem that in the power save mode, the nap mode has a very short refresh time for refreshing the data value of the capacitor and the power down mode has no time limit but a long time in the prior Rambus DRAM, the present duty cycle correction circuit makes the capacitance lost in transition from the power save mode to the normal mode to compulsorily correct to a predetermined value, thereby reducing the refresh time.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A duty cycle correction circuit of a delay locked loop of Rambus DRAM having a normal mode and a power save mode including a nap mode and a power down mode, comprising:

a signal input unit receiving a first control signal, an enable signal, a first input signal and a first input bar signal, and outputting signals differentially amplifying the first input signal and the first input bar signal by a first potential difference to a first node and a second node when the first control signal indicates a nap mode in a state that the enable signal is active, and outputting signals differentially amplifying the first input signal and the first input bar signal by a second potential difference to a first node and a second node when the first control signal indicates the normal mode in a state that the enable signal is active;

a signal output unit including:
   a first storage unit connected between the first node and ground voltage and storing the signals of the first node,
   a second storage unit connected between the second node and ground voltage and storing the signals of the second node,
   a first voltage supplying unit transmitting ground voltage to the first node when a second signal indicates the power down mode,
   a second voltage supplying unit transmitting ground voltage to the second node when the second control signal indicates the power down mode,
   a first transmission gate unit transmitting ground voltage a signal of the first node to a first output terminal when the second control signal indicates a normal mode,
   a second transmission gate unit transmitting a signal of the second node to a second output terminal when the second control signal indicates a normal mode,
   a third storage unit connected between the first output terminal and ground voltage and storing signals of the first output terminal,
   a fourth storage unit connected between the second output terminal and ground voltage and storing signals of the second output terminal,
   a third voltage supplying unit discharging the first output terminal to ground voltage when the second control signal indicates the power down mode,
   a fourth voltage supplying unit discharging the second output terminal to ground voltage when the second control signal indicates the power down mode; and a signal transfer unit connected between the signal input unit and the signal output unit, the signal transfer unit connecting the signal input unit and the signal output unit when the third control signal indicates the normal mode, and the signal transfer unit blocking the connection between the signal input unit and the signal output unit when the third control signal indicates the power save mode.

2. The duty cycle correction circuit as claimed in claim 1, wherein each of the first to fourth storing units is comprised of a capacitor.

3. The duty cycle correction circuit as claimed in claim 2, wherein the capacitor is comprised of a NMOS transistor.

4. The duty cycle correction circuit as claimed in claim 1, wherein each of the first and second voltage supply units is comprised of a PMOS transistor.

5. The duty cycle correction circuit as claimed in claim 1, wherein each of the third and fourth voltage supply units is comprised of a NMOS transistor.

6. The duty cycle correction circuit as claimed in claim 1, wherein the first and second transmission gate units are comprised of a PMOS transistor and a NMOS transistor.

7. The duty cycle correction circuit as claimed in claim 1, wherein the signal transfer unit is comprised of a transmission gate.

8. The duty cycle correction circuit as claimed in claim 7, wherein the transmission gate is comprised of a PMOS transistor and a NMOS transistor.

* * * * *